United States Patent [19]

Littlebury et al.

[11] Patent Number: 4,968,931
[45] Date of Patent: Nov. 6, 1990

[54] APPARATUS AND METHOD FOR BURNING IN INTEGRATED CIRCUIT WAFERS

[75] Inventors: Hugh W. Littlebury, Chandler; Marion I. Simmons, Tempe, both of Ariz.

[73] Assignee: Motorola, Inc., Schaumburg, Ill.

[21] Appl. No.: 431,345

[22] Filed: Nov. 3, 1989

[51] Int. Cl.$^5$ ............. G01R 35/00; G01R 31/02
[52] U.S. Cl. .................... 324/158 R; 324/73.1; 324/158 F; 324/158 P
[58] Field of Search ........... 324/158 F, 158 P, 158 R, 324/73.1, 72.5; 371/20.1, 21.1, 15.1, 16.1; 437/8; 365/201

[56] References Cited

U.S. PATENT DOCUMENTS

| | | | |
|---|---|---|---|
| 3,710,251 | 1/1973 | Hagge et al. | 324/158 F |
| 3,970,934 | 7/1976 | Aksu | 324/158 F |
| 4,038,599 | 7/1977 | Bove et al. | 324/158 F |
| 4,636,725 | 1/1987 | Santomango et al. | 324/158 F |
| 4,636,726 | 1/1987 | Santomango et al. | 324/158 F |
| 4,757,255 | 7/1988 | Margozzi | 324/158 F |
| 4,799,009 | 1/1989 | Tada et al. | 324/72.5 |
| 4,817,273 | 4/1989 | Lape et al. | 324/158 F |
| 4,899,099 | 2/1990 | Mendenhall et al. | 324/72.5 |

FOREIGN PATENT DOCUMENTS 0018233  1/1989  Japan ................. 324/158 F

OTHER PUBLICATIONS

Belyeu et al; "Dynamic Burn-In System"; IBM Technical Disclosure Bulletin; vol. 22, No. 8A, Jan. 1980; pp. 3065-3068.

Primary Examiner—Reinhard J. Eisenzopf
Assistant Examiner—Vinh P. Nguyen
Attorney, Agent, or Firm—Joe E. Barbee; Stuart T. Langley

[57] ABSTRACT

A method of burning in integrated circuits on a semiconductor wafer is provided, wherein a burn-in chamber having a flexible membrane probe which is sized so that it can couple to a plurality of contact pads on the semiconductor wafer at one time. The semiconductor wafer is heated to a predetermined burn-in temperature and a bladder which lies behind the membrane probe is inflated so that the membrane probe couples to each of the plurality of contact pads on the wafer. The membrane probe is coupled to an exercise circuit which exercises all of the integrated circuits on the wafer in parallel for a predetermined time.

13 Claims, 2 Drawing Sheets

APPARATUS AND METHOD FOR BURNING IN INTEGRATED CIRCUIT WAFERS

BACKGROUND OF THE INVENTION

The present invention relates, in general, to methods of burning in integrated circuits, and more particularly, to a method of burning in integrated circuits in wafer form.

It has long been known that most integrated circuits are subject to a certain infant mortality level caused by latent defects in the devices. In particular, semiconductor memories which have a relatively large die size and use particularly thin gate oxides, are susceptible to infant mortality problems. The bulk of these early failures can be gleaned out by extensively exercising the circuits at high temperature. Exercising the circuit means to apply power to the circuit, and to send data signals to the circuit which activate various portions of the circuit. A memory circuit which comprises thousands or millions of memory cells, for example, is exercised by addressing each memory cell and storing and retrieving data from that cell. When this process is performed at high temperature, it is called burn-in.

Typically, memory circuits are burned-in for 72 or more hours at temperatures exceeding 100° C. In the past, this process has been performed after the circuits have been assembled and tested. The burn-in process requires that the semiconductor packages be loaded into boards of fifty of more units so that they can be exercised in parallel. The boards are then loaded into ovens which control the ambient temperature during burn-in.

Increasingly stringent reliability requirements for semiconductor memories have led many manufacturers to burn-in 100% of their product before shipment. The physical space required to house burn-in ovens for a single manufacturer is enormous. Burn-in of memory circuits alone for a single manufacturer may occupy several city blocks of multi-story buildings. Not only physical space is lost; the power required to heat the burn-in ovens and power the exercising circuits is considerable. This is because integrated circuits from a single wafer once packaged, loaded into boards, and loaded into an oven, will take up several cubic feet of space which must then be heated and cooled to perform the burn-in.

Not only is the physical cost high but labor cost is high also. Loading packaged integrated circuits into boards and removing them from boards is labor intensive and is usually a manual operation. Additionally, after burn-in integrated circuits must be repackaged in shipping tubes or boxes so that they can be further processed or sold. These labor intensive operations can add days to the cycle time of a burn-in operation. Attempts to automate board loading and packaging processes have met with little success, due to the delicate nature of the processes.

Although the burn-in operation is designed to improve the reliability of the integrated circuits, often times it compromises the quality of packaged devices. Manual loading and unloading of integrated circuits often damages leads which extend outside the integrated circuit package. This damage is usually not repairable and results in completely functional devices being rejected for physical quality problems. In addition to lead damage, package damage can occur. Also, handling of packaged integrated circuits increases the chances of damage to the circuits themselves by electrostatic discharge. Although burn-in is necessary to provide the desired reliability, the above-mentioned quality limitations have long been a costly problem for circuit manufacturers.

It has been found that some wafers contain a much higher percentage of burn-in failures than other wafers. It has also been found that wafers with a high reject percentage will have a high reject rate early on in the burn-in process. In the past, though, good and marginal wafers were mixed together so that when the product was packaged and ready for burn-in, there was no way to identify circuits which came from a single wafer. In order to ensure that marginal product was removed during burn-in, longer burn-in times and higher temperatures were required. It would be advantageous to have a method of integrated circuit burn-in which grouped the circuits which were formed on the same wafer together.

Accordingly it is an object of the present invention to provide a method of burning in integrated circuits in wafer form.

It is another object of the present invention to provide a method of burning in integrated circuits which requires little floor space.

It is another object of the present invention to provide a method for burning in wafers which reduces the power and time required for burn-in.

It is still another object of the present invention to provide a method of burning in integrated circuits which eliminates manual loading and unloading of boards.

It is another object of the present invention to provide a method of burning in integrated circuits which improves package quality.

SUMMARY OF THE INVENTION

These and other objects and advantages of the present invention are achieved by a method of burning in integrated circuits on a semiconductor wafer. A burn-in chamber is provided with a flexible membrane probe which is sized so that it can couple to a plurality of contact pads on the single semiconductor wafer at one time. The wafer is heated to a predetermined burn-in temperature and a bladder, which lies behind the membrane probe, is inflated so that the probe couples to each of the contact pads on the wafer. The membrane probe is coupled to an exercise circuit which exercises all of the integrated circuits on the wafer in parallel for a predetermined time.

DETAILED DESCRIPTION OF THE DRAWINGS

Figure 1:
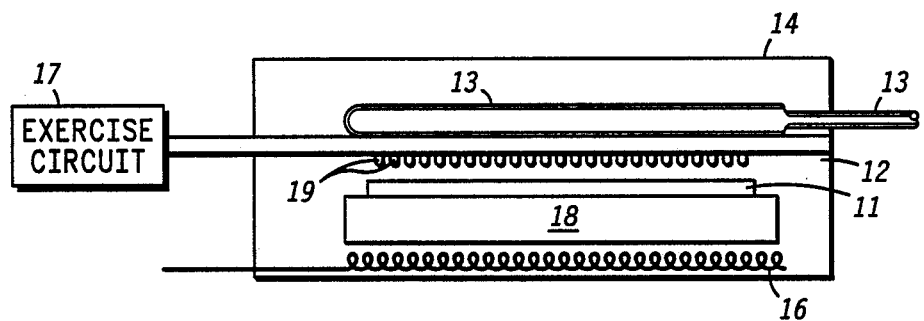
FIG. 1 illustrates a cross sectional view of a burn-in chamber of the present invention.

FIG. 1 shows a cross sectional view of a single wafer burn-in chamber of the present invention. FIG. 1 illustrates an extremely simplified view of the burn-in chamber; many modifications of the chamber to adapt it to specific applications will be obvious to those of skill in the art. Semiconductor wafer 11 rests on wafer stage 18. Wafer stage 18 functions primarily as a mechanical support but may be adapted to align wafer 11, as will be described hereinafter. Heater 16 is located near wafer stage 18, or alternatively may be integrated into wafer stage 18. Heater 16 must be able to heat wafer 11 to a pre-determined burn-in temperature. This may be accomplished by a resistive heating coil or a ceramic heater. It may be desirable to cool wafer stage 18 during burn-in also, in which case a cooling means would supplement or replace heater 16. Such a cooling means may comprise a moving liquid or moving air heat exchange system. Heater 16 is controlled from outside enclosure 14.

Membrane probe 12 is mounted either permanently or temporarily inside enclosure 14 so that a plurality of probe bumps 19 extend downward towards wafer 11. Membrane 12 comprises a flexible printed circuit (PC) board material on which probe bumps 19 are formed on a bottom side and conductive lines (not shown) are formed on a top side which interconnect the probe bumps. Flexible membrane 12 extends outside enclosure 14 as do the interconnections formed on the top side of membrane 12. A conventional electrical exercising circuit 17 is coupled to the conductive interconnects 29 at an edge of membrane 12. The electrical exercising circuit 17 serves to power the integrated circuits during burn-in and to provide signals to the integrated circuits which activate selected devices in the integrated circuits. Electrical exercising circuit 17 is similar to a circuit used to exercise packaged devices, and will vary somewhat for each type of circuit to be tested.

A bladder 13 is provided on a side of membrane probe 12 which is opposite wafer 11. Bladder 13 is a flexible balloon like material which can be filled with gas or liquid to expand and push membrane probe 12 outward towards wafer 11.

Figure 2:
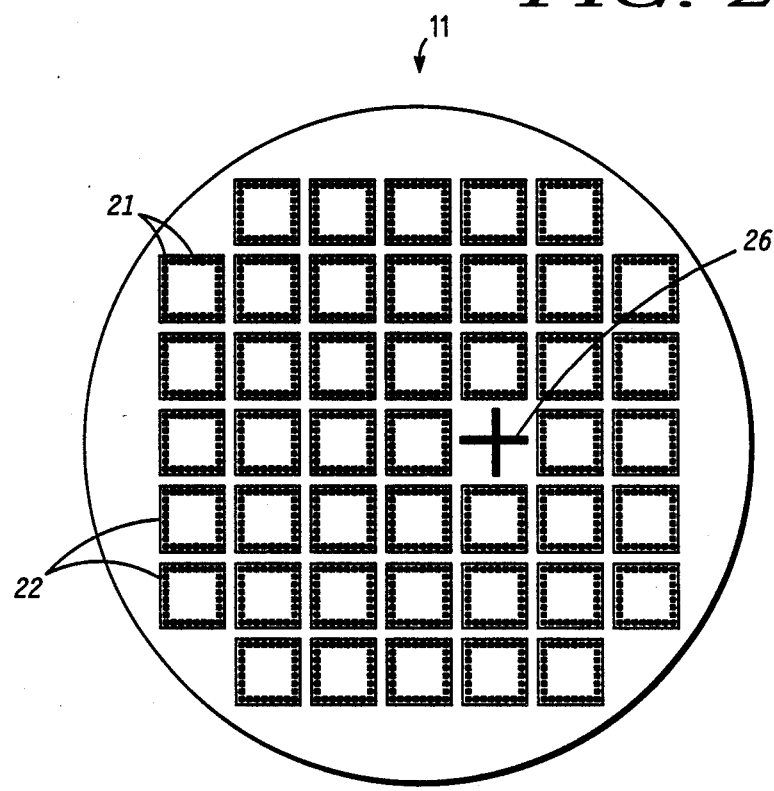
FIG. 2 illustrates a plan view of semiconductor wafer used in the present invention.
Figure 3:
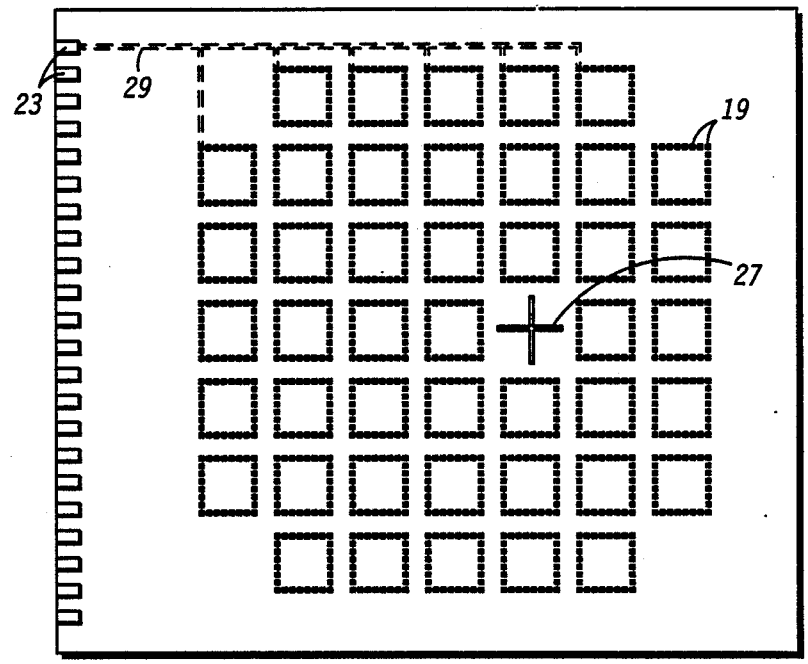
FIG. 3 illustrates a plan view of a bottom surface of a membrane probe used in the wafer chamber shown in FIG. 1.

FIGS. 2 and 3 illustrate a semiconductor wafer and the membrane probe for that wafer, respectively. Semiconductor wafer 11 has a plurality of integrated circuits formed thereon. Each integrated circuit has a pattern of contact pads 21 which are used for passing electrical signals to and from integrated circuits 22. Circuits 22 are identical to each other and electrically isolated from each other except for sharing a common substrate. Because the integrated circuits are coupled in parallel during burn-in, sharing a common substrate is an advantage and simplifies connections to the devices. Alignment aids 26 and 27 shown in FIGS. 2 and 3 respectively, will be discussed in greater detail hereinafter.

FIG. 3 illustrates a bottom surface of membrane probe 2 used to burn-in the wafer shown in FIG. 2. A pattern of probe bumps 19 is formed which corresponds to the pattern of contact pads 21 on wafer 11. Probe bumps 19 extends several mils downward from the bottom side of membrane probe 12. Since membrane probe 12 is essentially a printed circuit board, conventional printed circuit board techniques can be used to form probe bumps 19. Likewise, conventional techniques can be used to form conductive interconnections 29 which are formed on the top side of membrane probe 12. FIG. 3 illustrates only a few of the conductive interconnections 29 which would normally be formed, and they are illustrated in phantom to indicate that they are preferably formed on the top side of membrane 12.

Usually, the conductive interconnections will be used to couple each of integrated circuits 22 to each other in parallel during burn-in. Contact pads 21 shown in FIG. 2 comprise signal, power, and ground connections to the integrated circuit. Likewise, signal, power, and ground connections are made at contacted pads 23 formed at an edge of membrane probe 12. Contact pads 23 are used to couple membrane probe 12 to an external exercising circuit which is used to electrically exercise integrated circuits 22. Membrane probe 12 is flexible and thus must be mounted on some kind of frame, or be mounted permanently within enclosure 14 shown in FIG. 1.

Figure 4:
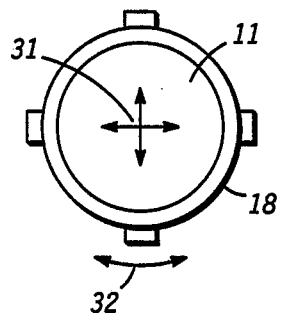
FIG. 4 illustrates a plan view of a wafer stage and wafer of the burn-in chamber in FIG. 1.

FIG. 4 shows a plan view of wafer stage 18. It will usually be necessary to align probe bumps 19 to contact pads 22 before they are coupled. To accomplish this, wafer stage 18 should be able to move in two orthogonal directions and rotationally, as shown by arrows 31 and 32 in FIG. 4. These motions can be accomplished by manual controls, or by drive means which are coupled to the wafer stage. Such stages are commonly used in semiconductor wafer processing and probing.

Figure 5:
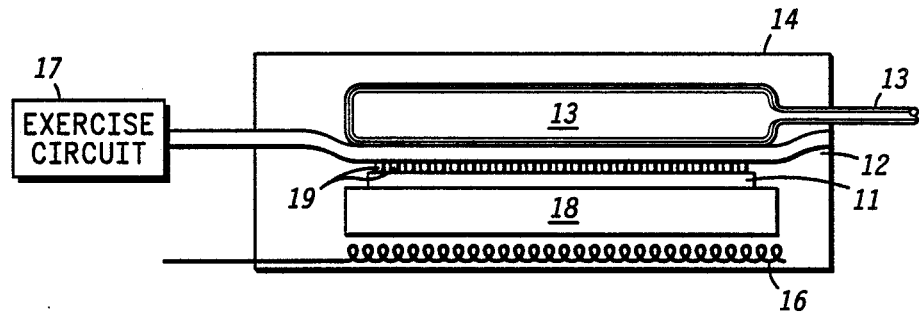
FIG. 5 illustrates a cross section of the wafer chamber of FIG. 1 during operation.

FIG. 5 illustrates a cross section of the wafer chamber shown in FIG. 1 during the burn-in process. A wafer 11 to be burned in is placed on wafer stage 18 inside enclosure 14. To avoid oxidation of exposed metal on wafer 11, it is desirable to fill enclosure 14 with an inert gas, such as nitrogen or argon, before heating wafer 11. Heater 16 is activated to bring wafer stage 18 and wafer 11 to the predetermined burn-in temperature preferably 100° C. This must be done before probe bumps 19 and contact pads 21 are aligned to each other in order to account for any mismatch in thermal coefficient of expansion between membrane probe 12 and wafer 11. It should be noted that the pattern of probe bumps 19 formed on membrane probe 12 will be slightly smaller or larger than the pattern of contact pads 21 on wafer 11 due to this mismatch of thermal coefficient of expansion. Once wafer 11 and enclosure 14 have stabilized at the predetermined burn-in temperature, probe bumps 19 are aligned to contact pads 22 by rotating and moving wafer stage 18 as shown in FIG. 4. Preferably, automatic alignment is accomplished by providing a transparent area 27 on membrane probe 12 which is an alignment aid. Referring again to FIGS. 2 and 3, alignment target 27 formed in membrane probe 12 corresponds to alignment key 26 formed on wafer 11. If optical alignment aids 26 and 27 are to be used, bladder 13, shown in FIG. 1, must be transparent. Optical alignment of key 26 to target can be accomplished through bladder 13 and the transparent portion of membrane probe 12. A wide variety of patterns may be used for alignment aids 26 and 27.

Once membrane probe 12 and wafer 11 are aligned to each other, bladder 13 is inflated to stretch membrane probe 12 and push probe bumps 19 into contact pads 22. In this manner the exercise circuit is coupled to each of the integrated circuits 22 formed on wafer 11. The exercise circuit is then activated for a predetermined period of time to burn-in all of the integrated circuits 22 in parallel. After burn-in, integrated circuits 22 are probed or tested to identify devices which are no longer functional.

Membrane probe 12 can be configured so that integrated circuits 22 can be monitored periodically during the burn-in process. Such a configuration is accomplished by configuring conductive lines 29 so that individual circuits 22 can be tested for functionality. If this is done, it is helpful to record the location of functional devices on wafer 11 either manually or automatically, and to tally the number of non-functional devices. In this manner, integrated circuits 22 which fail during the test can be detected early on in the burn-in process. If a large number of circuits fail early in testing, burn-in can be stopped and the wafer discarded. Likewise, if no burn-in failures are found after a predetermined time, burn-in can be stopped early, as the chances of finding additional failures on such a wafer are low. This process is called active burn-in and can greatly reduce burn-in time required by relying on the fact that integrated circuits on a single wafer share many common characteristics including infant mortality rate.

Usually, integrated circuits 22 will generate a significant amount of heat while being exercised by the exercise circuit. Because of the relatively low thermal mass of wafer stage 18 due to its small size, this excess heat produced by integrated circuits 22 will often be enough to maintain wafer 11 at a desired burn-in temperature. In fact, it may often be necessary to cool wafer stage 18 so that the temperature does not rise beyond burn-in temperature. This largely eliminates any need for external heating power for burn-in. This captured heating power greatly increases the efficiency of the burn-in process.

Modifications of the burn-in chamber shown in FIG. 1 can be made to provide varying degrees of automation. For example, wafers can be loaded automatically onto a wafer stage 18, wafers can be automatically aligned to membrane probe 12, and automatically unloaded when the burn-in process is complete. Burning in circuits in wafer form is particularly suited to further automation since a wide variety of automatic wafer handling equipment is commercially available. Automation greatly reduces the time required for manual loading and unloading of boards. Obviously, package and lead damage due to burn-in are completely eliminated because burn-in is completed before packaging has begun. Reducing handling also limits the integrated circuits 22 exposure to electrostatic discharge, which improves yield. Finally, the greatest saving is achieved by detecting marginal and defective circuits prior to packaging so that assembly costs are not incurred on product which fails burn-in.

By now it should be appreciated that an improved method of burning in integrated circuits is provided, wherein a plurality of integrated circuits on a wafer are burned-in in parallel in a small chamber. Using a membrane probe having a plurality of probe bumps formed thereon, all of the integrated circuits formed on a wafer are coupled in parallel to each other and to an exercise circuit Wafers can be easily burned in at a predetermined temperature and maintained at the predetermined temperature by their own operating power dissipation. Because the circuits are burned-in in wafer form, the process is easily automated using conventional automatic wafer handling equipment.

We claim:

1. A method of burning in integrated circuits (ICs) comprising the steps of: providing a plurality of unpackaged ICs, wherein each of the ICs has a plurality of contact pads thereon; providing a flexible means for probing having a probe for each contact pad of the plurality of ICs; providing a means for controlling the temperature of the ICs; providing a means for electrically exercising the ICs which is coupled to the means for probing; placing the ICs in the chamber; adjusting the temperature using the means for controlling the temperature so that the wafer is at a predetermined burn in temperature; coupling the contact pads of the plurality of ICs to the means for electrically exercising using the means for probing; and exercising the ICs.

2. The method of claim 1 wherein the ICs are semiconductor memories.

3. The method of claim 1 wherein after the step of adjusting the temperature the ICs are aligned to the means for probing.

4. The method of claim 1 further comprising the steps of: functionally testing the ICs after exercising the ICs; and recording the location of functional ICs.

5. A method of burning in integrated circuits (ICs) comprising the steps of: providing a plurality of ICs, wherein each of the ICs has a plurality of contact pads thereon; providing a means for probing for contacting said plurality of contact pads, wherein the means for probing comprises a flexible membrane probe; providing a means for controlling the temperature of the ICs; providing a means for electrically exercising the ICs which is coupled to the means for probing; placing the ICs in the chamber; adjusting the temperature using the means for controlling the temperature so that the wafer is at a predetermined burn-in temperature; coupling the contact pads to the means for electrically exercising using the means for probing; and exercising the ICs.

6. The method of claim 5 further comprising the steps of: providing an inflatable bladder positioned on a side of the flexible membrane probe opposite the integrated circuit; inflating the bladder so as to push the membrane probe into the IC contact pads, thereby coupling the contact pads to the means for electrically exercising.

7. An apparatus for burning-in unpackaged integrated circuits in a wafer comprising: a means for exercising the integrated circuits; a flexible membrane probe coupled to the means for exercising; a means for holding the wafer; a drive means for coupling the means for probing to the wafer; a means for heating the wafer.

8. The apparatus of claim 7 further comprising an enclosure surrounding the means for probing, and surrounding the wafer, wherein an inert gas fills the enclosure.

9. A method of burning in a plurality of integrated circuits (ICs) simultaneously on a wafer comprising the steps of: providing a plurality of contact pads on the wafer; providing a flexible means for probing said plurality of contact pads, a means for temperature control, and a means for holding the wafer:, providing a means for electrically exercising the ICs which is coupled to the means for probing; placing the wafer on the means for holding the IC; adjusting the temperature of the wafer using the means for temperature control so that the wafer is at a predetermined burn-in temperature; coupling the contact pads to the means for electrically exercising using the means for probing; and exercising the IC.

10. The method of claim 9 further comprising the steps of: providing an alignment target on the wafer; providing an alignment key on the means for probing; and automatically aligning the alignment key to the alignment target.

11. The method of claim 9 further comprising the steps of: providing an enclosure surrounding the means for probing and the means for holding the wafer; and filling the enclosure with an inert gas before adjusting the temperature.

12. The method of claim 9 wherein the ICs are semiconductor memories.

13. A method of burning in a plurality of integrated circuits (ICs) formed on a wafer comprising the steps of: providing a plurality of contact pads on the wafer; providing a means for probing, wherein the means for probing comprises a flexible membrane probe; providing means for temperature control; providing a means for holding the wafer; providing a means for electrically exercising the ICs which is coupled to the means for probing; placing the wafer on the means for holding the IC; adjusting the temperature of the wafer using the means for temperature control so that the wafer is at a predetermined burn-in temperature; coupling the contact pads to the means for electrically exercising using the means for probing; and exercising the ICs.

* * * * *